US006774532B1

(12) United States Patent
Marshall et al.

(10) Patent No.: US 6,774,532 B1
(45) Date of Patent: Aug. 10, 2004

(54) SELF-POWERED MICROTHERMIONIC CONVERTER

(75) Inventors: Albert C. Marshall, Sandia Park, NM (US); Donald B. King, Albuquerque, NM (US); Kevin R. Zavadil, Bernalillo, NM (US); Stanley H. Kravitz, Placitas, NM (US); Chris P. Tigges, Albuquerque, NM (US); Gregory A. Vawter, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 173 days.

(21) Appl. No.: 10/028,144

(22) Filed: Dec. 20, 2001

Related U.S. Application Data

(63) Continuation-in-part of application No. 09/895,350, filed on Jun. 28, 2001, now Pat. No. 6,509,669, and a continuation-in-part of application No. 09/895,759, filed on Jun. 28, 2001, now Pat. No. 6,407,477, and a continuation-in-part of application No. 09/895,372, filed on Jun. 28, 2001, now Pat. No. 6,411,007, and a continuation-in-part of application No. 09/257,336, filed on Feb. 25, 1999, now Pat. No. 6,563,256.

(51) Int. Cl.[7] .......... H01L 37/00
(52) U.S. Cl. .......... 310/304; 310/305; 60/203.1; 375/321; 136/201
(58) Field of Search .......... 310/304–306; 60/203.1; 376/321; 136/201

(56) References Cited

U.S. PATENT DOCUMENTS

| | | | | | |
|---|---|---|---|---|---|
| 3,578,991 | A | * | 5/1971 | Gross et al. | 376/321 |
| 3,601,638 | A | * | 8/1971 | Busse | 376/321 |
| 3,807,827 | A | * | 4/1974 | De Steese et al. | 445/51 |
| 3,843,896 | A | * | 10/1974 | Rason et al. | 310/306 |
| 3,932,776 | A | * | 1/1976 | Dunlay et al. | 310/306 |
| 4,280,074 | A | * | 7/1981 | Bell | 310/306 |
| 5,219,516 | A | * | 6/1993 | Horner-Richardson et al. | 376/321 |
| 5,492,570 | A | * | 2/1996 | Horner-Richardson et al. | 136/200 |
| 5,973,259 | A | * | 10/1999 | Edelson | 136/254 |
| 6,100,621 | A | * | 8/2000 | Rasor et al. | 310/306 |
| 6,294,858 | B1 | * | 9/2001 | King et al. | 310/306 |
| 6,407,477 | B1 | * | 6/2002 | King et al. | 310/306 |
| 6,411,007 | B1 | * | 6/2002 | King et al. | 310/306 |
| 6,509,669 | B1 | * | 1/2003 | King et al. | 310/306 |
| 6,605,339 | B1 | * | 8/2003 | Marshall et al. | 428/220 |
| 6,619,028 | B2 | * | 9/2003 | Kreiner et al. | 60/202 |

OTHER PUBLICATIONS

U.S. patent application 09/895,350 "*Microminiature Thermionic Converters*", Donald B. King, Laurence P. Sadwick and Bernard R. Wensman, assigned to Sandia Corporation, Albuquerque, New Mexico.

U.S. patent application 09/895,372 "*Chemical Vapor Deposition Techniques and Related Methods for Manufacturing Microminiature Thermionic Converters*", Donald B. King, Laurence P. Sadwick and Bernard R. Wensman, assigned to Sandia Corporation, Albuquerque, New Mexico.

(List continued on next page.)

*Primary Examiner*—Thomas M. Dougherty
(74) *Attorney, Agent, or Firm*—Robert D. Watson

(57) ABSTRACT

A self-powered microthermionic converter having an internal thermal power source integrated into the microthermionic converter. These converters can have high energy-conversion efficiencies over a range of operating temperatures. Microengineering techniques are used to manufacture the converter. The utilization of an internal thermal power source increases potential for mobility and incorporation into small devices. High energy efficiency is obtained by utilization of micron-scale interelectrode gap spacing. Alpha-particle emitting radioisotopes can be used for the internal thermal power source, such as curium and polonium isotopes.

54 Claims, 17 Drawing Sheets

OTHER PUBLICATIONS

U.S. patent application 09/257,336 "*Low Work Function Materials for Microminiature Energy Conversion and Recovery Applications*", Kevin R. Zavadil, Judith A. Ruffner and Donald B. King, assigned to Sandia Corporation, Albuquerque, New Mexico.

U.S. patent application "*Micro Heat Barrier*", Albert C. Marshall, Stanley H. Kravitz, Chris P. Tigges and Gregory Allen Vawter, assigned to Sandia Corporation, Albuquerque, New Mexico.

U.S. patent application "*Methods for Fabricating a Micro Heat Barrier*", Albert C. Marshall, Stanley H. Kravitz, Chris P. Tigges and Gregory Allen Vawter, assigned to Sandia Corporation, Albuquerque, New Mexico.

G. N. Hatsopoulos and E. P. Gyftopoulos, "*Thermionic Energy Conversion*" vol. 1: *Processes and Devices* Copyright 1973 pp. 17.

M.M. El–Wakil, "*Nuclear Energy Conversion*" Copyright 1982 pp. 450–495.

Yuri V. Nikolaev, Stanislav A. Eryomin, Yuri D. Karpechenko, Michael D. Kochetkov "*Close–Spaced Thermionic Converters for Power Systems*" Proceedings Thermionic Energy Conversion 1993, Specialist Conference May 5–7, 1993, Goteborg, Sweden.

Gary Fitzpatrick, et al "*Demonstration of Close–Spaced Thermionic Converters*" 1993 $28^{th}$ Intersociety Energy Conversion Engineering Conference.

Kucherov R. Ya., Nikolaev Yu.V, "*Closed Space Thermionic Converter With Isothermic Electrodes*" 1994 $29^{th}$ Intersociety Energy Conv. Engineering Conference VI.

Gary O. Fitzpatrick, et al "*Close–Spaced Thermionic Converters with Active Spacing Control and Heat–Pipe Isothermal Emitters*" 1996 $31^{st}$ Intersociety Energy Conversion Engineering Conference.

G. D. Mahan and L. M. Woods, "*Multilayer Thermionic Refrigeration*" Physical Review Letters, vol. 80, Num 18 May 4, 1998.

Ali Shakouri and John E. Bowers, "*Heterostructure Integrated Thermionic Coolers*" 1997 American Institute of Physics.

J. P. Fleurial et al "*Development of Thick–Film Thermoelectric Microcoolers using Electrochemical Deposition*" Mat. Res. Soc. Symp. Proc. vol. 545 Thermoelectric Materials 1998—The Next Generation Materials for Small–Scale Refrigeration and Power Generation Applications, 1999 Materials Research Society.

* cited by examiner

SELF-POWERED MICROTHERMIONIC CONVERTER

CROSS-REFERENCE TO RELATED APPLICATIONS

This application is a continuation-in-part application of U.S. patent application Ser. No. 09/895,350 entitled "Microminiature Thermionic Converters," to King, et al., filed on Jun. 28, 2001, now U.S. Pat. No. 6,509,669, which issued Jan. 21, 2003; U.S. patent application Ser. No. 09/895,759 entitled "Thermionic Modules," to King, et al., filed on Jun. 28, 2001, now U.S. Pat. No. 6,407,477, which issued Jun. 18, 2002; U.S. patent application Ser. No. 09/895,372 entitled "Chemical Vapor Deposition Techniques and Related Methods for Manufacturing Microminiature Thermionic Converters," to King, et al., filed on Jun. 28, 2001, now U.S. Pat. No. 6,411,007, which issued Jun. 25, 2001; and U.S. patent application Ser. No. 09/257,336 entitled "Low Work Function Materials for Microminiature Energy Conversion and Recovery Applications," to Zavadil, Ruffner, and King, filed on Feb. 25, 1999, now U.S. Pat. No. 6,563,256, which issued May 13, 2003. This application is related to U.S. Pat. No. 6,294,858, "Microminiature Thermionic Converters", which issued Sep. 25, 2001 to King et al., and to co-pending applications "Micro Heat Barrier", Ser. No. 10/025,449 filed Dec. 19, 2001 by Marshall et al., and "Methods for Fabricating a Micro Heat Barrier", Ser. No. 10/025,718 filed Dec. 19, 2001 by Marshall et al. The specifications thereof of all of the above are incorporated herein by reference.

GOVERNMENT RIGHTS

The Government has rights to this invention pursuant to Contract No. DE-AC04-94AL85000 awarded by the U.S. Department of Energy.

BACKGROUND OF THE INVENTION

The present invention relates to microthermionic self-powered converters having high energy conversion efficiencies and to methods of manufacturing those converters using micromachining manufacturing techniques.

Thermionic generators were first proposed in 1915 by Schlichter, but many of the theoretical problems that existed at the inception of the idea persist today. Thermionic generators convert heat energy to electrical energy by an emission of electrons from a heated emitter electrode. The electrons flow from the emitter electrode, across an interelectrode gap, to a collector electrode, through an external load, and return back to the emitter electrode, thereby converting the heat energy to electrical energy. Historically, voltages produced are low, and the high temperature required to produce adequate current has produced numerous problems in maintaining the devices, including the unintended transfer of heat from the heated emitter electrode to the cold collector electrode. Practical thermionic conversion was demonstrated in 1957 by Hernquist in which efficiencies of 5–10% were reached with power densities of 3–10 W/cm$^2$. Generally, such efficiencies and power densities were not sufficient to be financially competitive in the energy market, thus reducing the application of such devices. Furthermore, such devices were too large for use as miniaturized electrical power sources.

Another problem, "space-charge effect," is described by Edelson (U.S. Pat. No. 5,994,638). A space-charge effect results when the build up of negative charge in the cloud of electrons between the two electrodes deter the movement of other electrons toward the collector electrode. Edelson cites two well-known methods for mitigating the space-charge effect: (1) reducing the spacing between electrodes to the order of microns, or (2) introducing positive ions into the electron cloud in front of the emitter electrode.

Introducing positive ions into the electron cloud in front of the emitter electrode generally consists of filling the interelectrode gap with an ionized gas. Thermionic converters with gas in the interelectrode gap are designed to operate with such ionized species, typically utilizing cesium vapor. Utilization of a cesium vapor results in a space charge neutralization, effectively eliminating the detrimental deterrence of electron flow. Cesium also plays a dual role by decreasing the work function of the device, i.e. the rate of electrons leaving a surface, by absorbing onto the emitter and collector surfaces, thereby allowing greater electron emission. However, too great of a pressure of cesium in the interelectrode gap will cause excess collisions between cesium atoms and electrons leaving the emitter electrode, reducing the efficiency of conversion. Therefore, a careful, complex balance must be maintained in a cesium vapor system. The current apparatus bypasses the complexities and efficiency losses of such a system (and its related expense) by lowering the space-charge effect through reduction of spacing between electrodes to the order of microns (i.e., 1–10 microns).

Reducing the spacing between electrodes to the order of microns has proved impractical with conventional manufacturing techniques. Fitzpatrick (U.S. Pat. No. 4,667,126) teaches "maintenance of such small spacing with high temperatures and heat fluxes is a difficult if not impossible technical challenge." The present invention overcomes the difficulty of reducing spacing by microengineering. U.S. Pat. No. 6,294,858 to King, et al., "Microminiature Thermionic Converters", which is hereby incorporated herein by reference, discloses a microminiature thermionic converter having a 1 micron electrode gap manufactured by integrated circuit (IC) semiconductor techniques. U.S. Pat. No. 6,299,083 to Edelson, "Thermionic Converter", also discloses a microminiature thermionic converter fabricated using MEMS techniques. Both King's device and Edelson's device are powered by an external source of heat; not by an internal, self-contained power source, as in the present invention.

Earlier thermionic converters relied on external heat sources (nuclear power, geothermal energy, solar energy, fossil fuel combustion, wood or waste combustion), which may not be readily available to a user especially if electricity is desired in powering a mobile miniature device.

The present invention, in contrast, with its incorporated thermal source, overcomes the very modern problem of mobility and also provides more choices for operating devices that do not necessarily need to be mobile. For example, devices that are fixed, but may need to be used in a limited space may not be able to harness the thermal energy sources used by earlier devices.

SUMMARY OF THE INVENTION

The apparatus of the present invention is a self-powered microthermionic converter. A preferred embodiment of the converter comprises an emitter electrode and a collector electrode, separated by a micron-scale spaced interelectrode gap, a self-contained (i.e., incorporated, integral) thermal power source in good thermal contact with the emitter electrode, and an electrical circuit connecting the collector electrode and emitter electrode through an external electrical load.

The interelectrode gap of a preferred embodiment is preferably less than about 10 μm, more preferably, between approximately 1 μm and 10 μm, and most preferably, between approximately 1 μm and 3 μm. The interelectrode gap preferably comprises a vacuum. Alternate embodiments utilize cesium (or barium) vapor at a low vapor pressure, unlike the more common high vapor pressure cesium systems utilized in prior art inventions. The proposed alternate configuration, using low pressure cesium, differs from a Knudsen diode in that a small quantity of cesium is sealed into the present device during manufacture, whereas the Knudsen diode requires an external source of cesium (i.e., a cesium source apparatus).

A radioactive isotope can be used as the "self-powered" thermal power source, such as alpha-emitting Curium-242, Curium-244, or Polonium-210. Alpha particles emitted from the isotope deposit their energy (heat) within the body of the isotope if the range of the alphas is much smaller than the physical dimensions of the body (e.g., the range of a 6 MeV alpha particle is about 13 microns in copper). If the body of the isotope is very well thermally insulated, then the deposited heat can raise the temperature to very high values, greater than 600 C.

The collector electrode and emitter electrode of the converter are preferably formed by depositing or growing at least one layer of thermionic electron emissive material on a substrate. The thermionic electron emissive material is preferably an alkaline earth oxide in combination with a refractory metal. Thermionic emissive materials can be selected from barium oxide, calcium oxide and strontium oxide; combinations of these oxides; along with additions of aluminum and scandium oxides, as adjunct oxides. The preferable refractory metal to incorporate into the electron emissive oxide is tungsten, but could also include rhenium, osmium, ruthenium, tantalum, and iridium, or any combination of these metals. Tungsten, rhenium, osmium, ruthenium and iridium, or any combination of these metals can also be used as terminating (capping) top layers on the oxide or mixed oxide/metal layer. Alternately, low-pressure alkali or alkaline earth metals, such as cesium and barium, can be used with a high work function metal like tungsten, tantalum, rhenium, osmium, ruthenium, molybdenum, iridium and platinum, or any combination of these metals. The oxides of like tungsten, tantalum, rhenium, osmium, ruthenium, molybdenum, iridium and platinum, or any combination of these metals can also be used with low-pressure alkali or alkaline earth metals, such as cesium and barium.

The emitter electrode length is preferably less than approximately 200 μm, more preferably, between approximately 50 μm and approximately 200 μm, and most preferably, between approximately 50 μm and approximately 100 μm.

An electrical insulator may be disposed between non-interacting portions of the emitter electrode and collector electrode. A thermal heat barrier must be included to prevent heat loss from the source. The thermal heat barrier can be selected from alumina, quartz, aerogel, a multifoil system or a microheat barrier system. In the microheat barrier approach, multiple, highly-reflective surfaces are separated by micro-spikes or micro-posts and are fabricated using microfabrication techniques.

The preferred temperature for operation for the present invention is between approximately 850 K and approximately 1200 K. More preferably, the temperature is between approximately 1100 K and approximately 1200 K.

The present invention is also directed to a self-powered microthermionic converter with a diode having a collector electrode and an emitter electrode, a fuel cup, a thermal power source within the fuel cup and an interelectrode gap spaced between the emitter electrode and an edge region outside of the fuel cup. The outer surface of the fuel cup is coated with a thermionic electron emissive layer to form the emitter electrode. The edge region is coated with a thermionic electron emissive layer to create a collector electrode. The diode of the embodiment is in electrical contact with an electric circuit.

The present invention also includes methods for thermionic power conversion by placing an incorporated thermal power source in thermal contact with an emitter electrode. The heated emitter electrode emits electrons which travel across a micron spaced interelectrode gap to a collector electrode. Upon reaching the collector electrode, the electrons flow through an external resistive load that may be integral to the same micro-chip housing the self-powered thermionic device, or that may be external to the self-powered thermionic device. After traveling through this load, the electrons return to the emitter electrode, thereby completing an electrical circuit. The method can include utilization of an incorporated thermal power source where the source is enclosed within the emitter electrode.

The present invention further includes a method for manufacturing the self-powered microthermionic converter apparatus. A thermally and electrically insulating material is used as a substrate and forms a fuel cup with a thermal power source from the substrate through micromachining techniques. At least one thermionic electron emissive layer is deposited on the outer surface of the fuel cup to comprise an emitter electrode. A collector electrode is formed within the substrate outside of the emitter electrode by depositing at least one layer of a thermionic electron emissive material on at least one wall of the substrate. The thermionic electron emissive layer or layers are preferably formed through chemical vapor deposition techniques (CVD). CVD is preferred for non-planar geometries, however, RF sputter deposition, physical vapor deposition, reactive deposition, laser ablation, or electrophoretic deposition can be used, as well. A micron spaced interelectrode gap is located between the collector electrode and emitter electrode. Micromachining techniques are preferably used to form the fuel cup and substrate wall utilized as the collector electrode surface. The converter is preferably incorporated into a micromachined wafer.

The method of the present invention also comprises forming a fuel cup by forming a fuel grid, aligning the grid with the cups, inserting the sources in the cups, capping the cups, and dissolving the grid. The cap is preferably made of a highly reflective surface, non-reactive metal, such as gold.

A primary object of the present invention is to provide a mobile, miniature, self-powered thermionic converter.

Another primary object of the invention is to provide a thermionic power source of reduced size for incorporation into the converter.

Another object of the invention is to increase the efficiency of a thermionic converter by reduction in size of the interelectrode gap to micron-scale.

A primary advantage of the present invention is the small size of the invention due to the incorporation of a radioisotopic thermal heat source, which need only be utilized in minute amounts, and has a relatively long lifetime (e.g., months). The incorporation of the source removes the need for the external heat sources necessary with prior art devices. This both increases the mobility and decreases the necessary size of the converter in combination with the heat source.

Another distinct advantage of the current invention is the incorporation of the thermionic converter directly into the chip or other device it is intended to power. Such chips or devices can include MEMS, IMEMS, and micro fuel cell devices.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
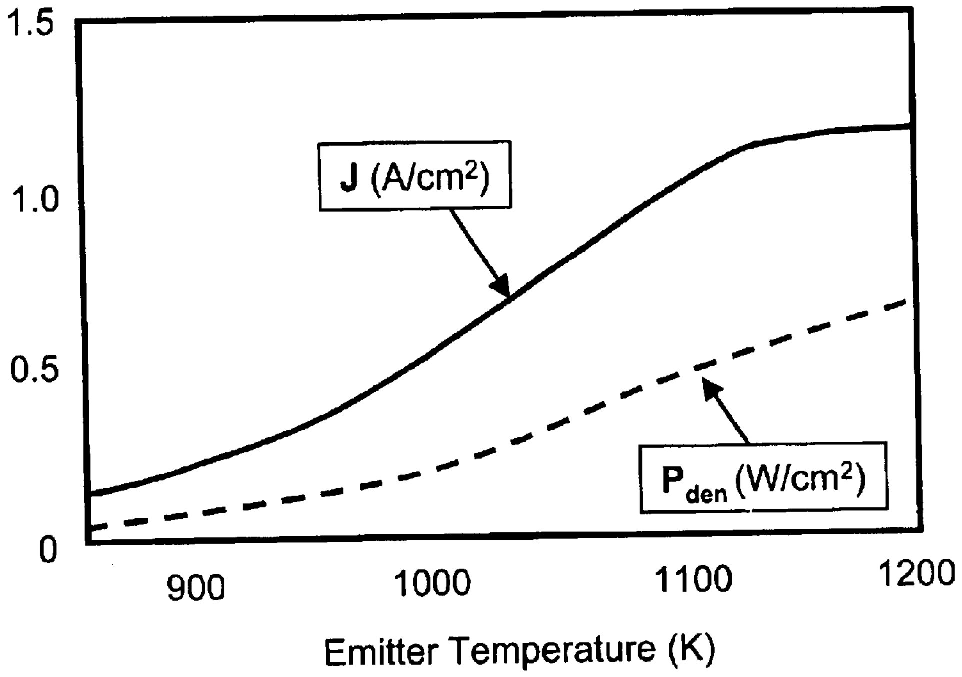
FIG. 1 is a graph showing the predicted current density, J, and power density, $P_{den}$, for the converter in relation to temperature in degrees Kelvin at the emitter electrode (these predictions were made using an analytic model that correctly includes thermionic emission and heat transfer effects, including thermal losses)

Microthermionic converters of the present invention are manufactured using semiconductor integrated circuit (IC) fabrication methods and bulk or surface micromachine manufacturing techniques. All elements of the diode (emitter electrode, collector electrode) are made using standard chemical vapor deposition techniques and etch techniques known by those skilled in the art in the semiconductor industry. Chemical vapor or physical deposition allows for accurate, reproducible crystalline growth of extremely thin layers of metals or oxides (for electrode formation).

The microthermionic converter is fabricated with an interelectrode gap space of preferably less than 10μm, more preferably between approximately 1 μm and 10 μm, and most preferably between approximately 1 μm and 3 μm, by utilizing microengineering techniques, thereby allowing the converter to be operated without significant performance penalty due to space-charge effects; in the absence of typically utilized high pressure cesium vapor system. These techniques are thoroughly detailed in the '858 patent to King, et al.

Unlike more common thermionic devices that utilize a high pressure cesium vapor system in the interelectrode gap (IEG), the present invention can utilize vacuum conditions within the interelectrode gap while still maintaining flow of electrons, without significant space-charge effect interruption of flow. The present converter achieves this with its micro-engineered micron-spaced interelectrode gap. Herein, the phrase "micron-spaced interelectrode gap" refers to an interelectrode gap of preferably less than 10 μm, more preferably between approximately 1 μm and 10 μm, and most preferably between approximately 1 μm and 3 μm.

Alternatively, the microthermionic converter can utilize an encapsulated, low pressure Cs or Ba vapor system in its interelectrode gap using a refractory, high-work function metal as a substrate for the thermionic electron emissive material. When using a low pressure, Cs or Ba vapor system, the Cs or Ba atoms will adsorb onto the electrode's metal surface, producing a lowered work function for the electrode.

The thermionic electron emissive materials utilized by the converter preferably include an alkaline earth oxide in combination with a refractory metal and adjunct oxides. Candidate alkaline earth oxides include barium, calcium and strontium oxides, combinations of these oxides, along with additions of aluminum and scandium oxides, as adjunct oxides. Refractory metals can be incorporated into the thermionic electron emissive oxide or mixture of oxides to facilitate thermochemistry. Candidate metals include tungsten, rhenium, osmium, ruthenium, tantalum, and iridium, or any combination of these metals. These mixtures are low work function materials (i.e., less than 2.5 eV). Use of these materials solely or in combination with higher work function terminating (capping) layers (e.g. tungsten, rhenium, scandium, ruthenium, osmium, iridium) allow the converter to be operated at lower temperatures than the typically used refractory metals, with higher work function, e.g., tungsten and molybdenum, as the solely utilized thermionic electron emissive materials. High work function refractory metals and their oxides can be used in combination with a low-pressure cesium or barium vapor to produce lower temperature, electron emissive electrodes.

Researchers at Philips (Aachen, Germany) have used rhenium and scandium oxide deposition on a macro-dispenser cathode that resulted in a work function of 1.2 eV and an emission coefficient of 8 $A \cdot cm^{-2}K^{-2}$.

We have produced a thin film version of an electron emissive material comprising scandium oxide capped barium, strontium, calcium oxide that has a work function of 1.2 eV and an emission coefficient of 70 $mA \cdot cm^{-2}K^{-2}$.

Thermionic electron emissive electrodes can be fabricated in thin film form by either co-depositing or sequentially depositing alkaline earth oxides, adjunct oxides and metals. Co-deposition allows for a finely dispersed heterogeneous mixture of oxide, adjunct oxide, and metal to facilitate subsequent thermochemistry. Alternately, multilayer films can be deposited to allow for a more coarsely dispersed heterogeneous mixture of oxide, adjunct oxide, and metal. A multilayer film allows for the selective termination (capping) of the thermionic electrode. Deposition techniques include chemical vapor deposition (CVD), RF sputter deposition, physical vapor deposition, reactive deposition, laser ablation, electrophoretic deposition, or combinations of these techniques. CVD could be used to deposit the alkaline earth oxide using barium hydroxide, to deposit an adjunct oxide like scandium oxide using scandium acetylacetonate, and a refractory metal like tungsten using tungsten hexafluoride, where the hydroxide, acetylacetonate, and hexafluoride represent volatile precursors suitable for an elevated temperature CVD process. RF sputter deposition can be used deposit both co-deposited and sequentially deposited films using a multi-target system with separate targets made form the emissive oxide, the adjunct oxide, and the desired metals. An example of a multilayer thermionic electron emissive film is a composite structure comprised of stacked layers of a mixed barium, strontium, and calcium oxide and scandium oxide on top of tantalum deposited onto a silicon wafer. The estimated work function of this combination is 1.7 eV. Alternately, the thermionic electron emissive materials can be comprised of modulated layers of a mixed barium, calcium, strontium oxide or a mixed barium, calcium, aluminum oxide with tungsten and scandium oxide. These compositionally modulated films have work functions of less than 2 eV and emission coefficients of greater than 20 $A \cdot cm^{-2}K^{-2}$.

The emitter and collector electrodes may be comprised of different, or the same, thermionic electron emissive material. Additionally, the work function or emission coefficients of the emitter and collector electrodes may be the same, or different.

The self-powered thermionic converter of the present invention incorporates a radioisotopic thermal power source. Curium-242 (or Cu-244) is particularly well suited as a heat source. It emits an alpha particle during radioactive decay at a rate sufficient to provide an acceptable thermal power density (1170 W/g), and has a sufficiently long half-life (i.e., 163 days for Cu-242 and 17.6 years for Cu-244) to provide sustained power. Other radioisotopes known in the art such as Polonium-210 (half-life=138 days, thermal power density=1320 W/g) can also be utilized in the present invention.

Heat from the spontaneous decay of the radioisotope is conducted to the emitter electrode, resulting in thermionic emission of electrons from the emitter surface. These electrons cross the vacuum interelectrode gap and are collected by the cold collector electrode. The electrons then return to the emitter electrode through an external electrical load connected in series to the electrodes, thereby providing electrical power to that external load. With the micron-scale size of the converter, the entire unit can be incorporated into the circuitry of the external load device, thereby easily incorporating the electricity generating thermionic converter into the device it operates.

The preferred range for a typical emitter dimension (length, diameter, etc.) is 50–200 microns, with a most preferred range of 50–100 microns. Heat from the spontaneous decay of a radioisotope is conducted to an emitter electrode, resulting in thermionic emission of electrons from the hot emitter surface. A thermal heat barrier is used in the converter to minimize heat loss from the thermal power source. Heat barrier materials such as alumina, quartz, and aerogel may be utilized in the converter, however, highly effective micro heat barriers are preferred.

Figure 2:
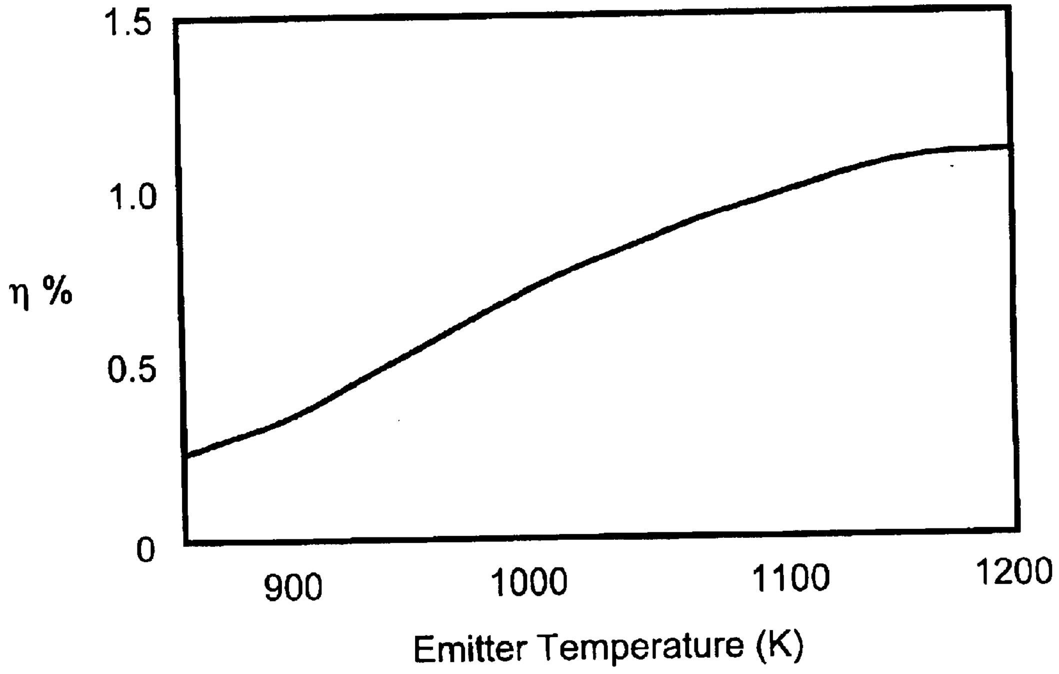
FIG. 2 is a graph depicting device efficiency, η, for the converter in relation to temperature in degrees Kelvin at the emitter electrode.
Figure 3A:
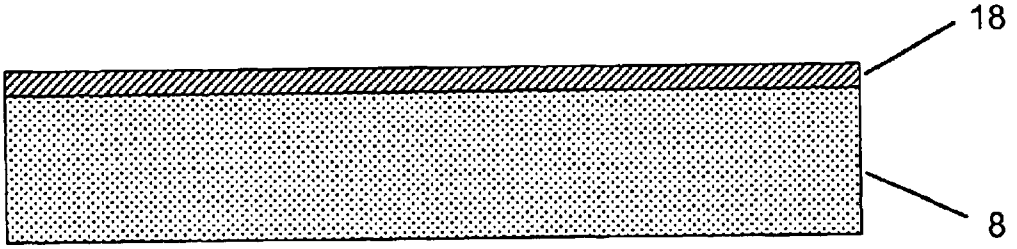
FIGS. 3(*a*)–3(*f*) schematically illustrate an example of steps for fabricating a microspike wafer, according to the present invention.
Figure 3B:
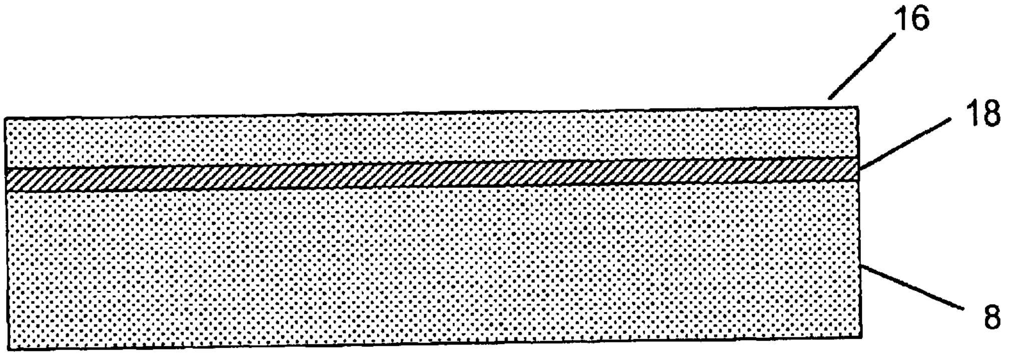
Figure 3C:
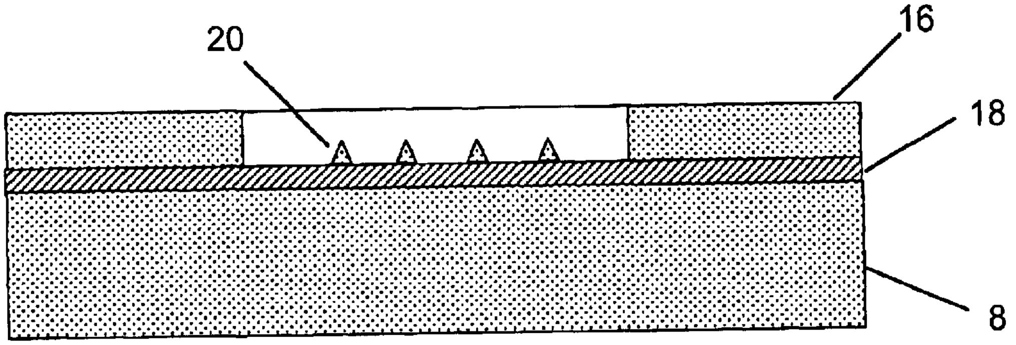
Figure 3D:
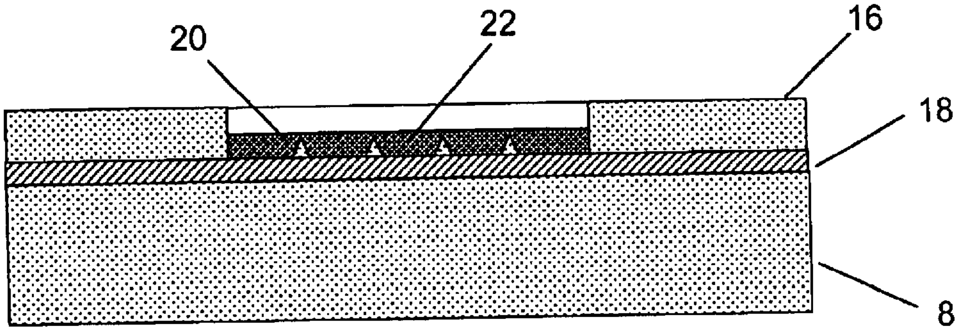
Figure 3E:
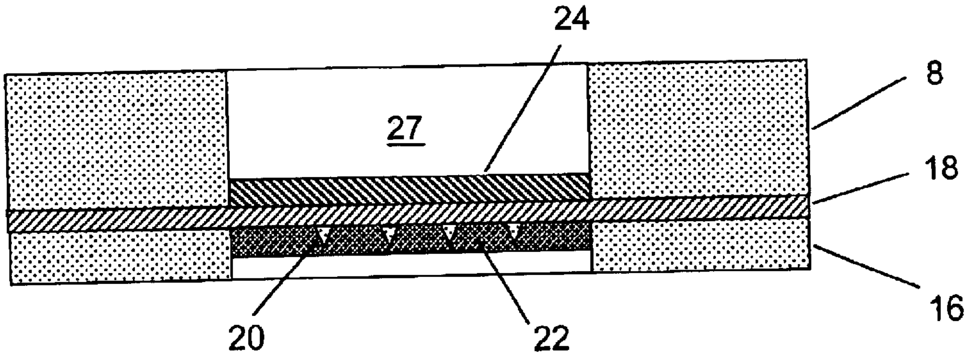
Figure 3F:
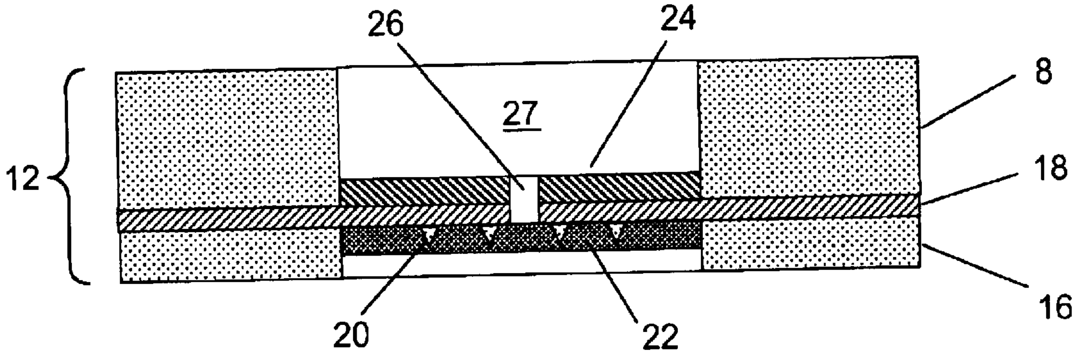

Simple thermal and thermionic electron emission models can determine the design and operation characteristics. These models give a projected performance of a device utilizing a particular isotope. The graphs in FIGS. 1 and 2 are predictions based on a thermal/thermionic analytical model for a Curium-242 radioisotope, demonstrating that the predicted power density, $P_{den}$ ($W/cm^2$), and current density, J ($A/cm^2$), optimize for such a converter when the $T_E$, or emitter temperature, is within the range of 1100–1200 K. Additionally, the percent efficiency, $\eta$ (%), of the converter optimizes within that same range, 1100–1200 K. Finally, for this prototype design, the length of the emitter $L_E$ is optimal within a range of 50–200 $\mu$m, with a preferred range of 50–100 $\mu$m, at the optimal temperature range. Smaller devices may be possible with improved micro-fabrication techniques.

FIGS. 3(*a*)–3(*f*) schematically illustrate an example of a method for fabricating a microspike wafer 12, according to the present invention. Collector wafer 10 and microspike wafer 12 are combined to form upper assembly 14. Microspike wafer 12 is utilized in both upper and lower assemblies of the preferred embodiment to act as a micro-heat barrier (i.e., microfoil insulation). Microspike wafer 12 can include multiple layers of microfoil (e.g., 2–12 layers), depending on the amount of thermal insulation required, which may vary in relation to the radioisotope utilized. Chemical vapor eposition techniques are preferably used to deposit various layers of material of which the elements of the thermionic converter are comprised.

In FIG. 3(*a*) a microspike wafer 12 is fabricated by growing (i.e., depositing) a first epitaxial layer 18 (i.e., AlGaAs) on a first substrate wafer 8. First epitaxial layer 18 serves as a "stop layer" useful when etching. First substrate wafer 8 is substantially flat and comprises a dielectric material (i.e., GaAs or silicon). In FIG. 3(*b*) a second epitaxial layer 18 (i.e., GaAs) is grown on top of the first epitaxial layer 16. Next, in FIG. 3(*c*) the second epitaxial layer 18 is patterned and etched to form microspike array 20 using micromachining techniques. Then, in FIG. 3(*d*), a protective layer of photoresist 22 is deposited over spike array 20. Next, in FIG. 3(*e*), first wafer 8 is inverted and then patterned and etched down to stop layer 18 through micromachining techniques to form first recess 27. Then, in FIG. 3(*e*), a highly reflective layer 24 is deposited over the pattern.

Highly reflective layer 24 can comprise a film of gold that is deposited by thermal evaporation, sputtering, electrodeposition, or chemical deposition. Other infrared reflective (IR) materials can be used, including platinum, titanium, or combinations thereof. Alternatively, the infrared reflective layer 24 can comprise a laminated stack of two alternating layers of IR transparent materials, where one material has a large difference in its index of refraction relative to the other. For example, highly reflective layer 24 can comprises four laminated layers of two alternating materials; a low index material (e.g., $SiO_2$, n=1.5), and a high index material (e.g., $TiO_2$, n=2.4). An example of a 4-layer HR stack can comprises $TiO_2/SiO_2/TiO_2/SiO_2$. The thickness of each layer in the HR stack can vary, depending on its particular location in the stack.

Finally, in FIG. 3(*f*) gas escape (or contact hole) 26 is cut into highly reflective layer 24 and stop layer 18, thereby completing formation of microspike wafer 12.

Microspike wafers comprising microspikes and one or more IR reflecting layers (e.g., microfoils) are preferably used for prevention of heat loss. The spike array can have its tips directed toward the thermal source location to minimize potential thermal contact. The shape of the spike can be cusp-like, with a sharp, pointed tip. This configuration aids in preventing heat loss. Alternatively, the cross-section shape of a microspike spike can be conical, pyramidal, or cylindrical. Multiple layers (e.g., 2–12) of infrared reflective layers or microfoils can be fabricated and stacked on top of one another to increase the effective thermal resistance.

Figure 4A:
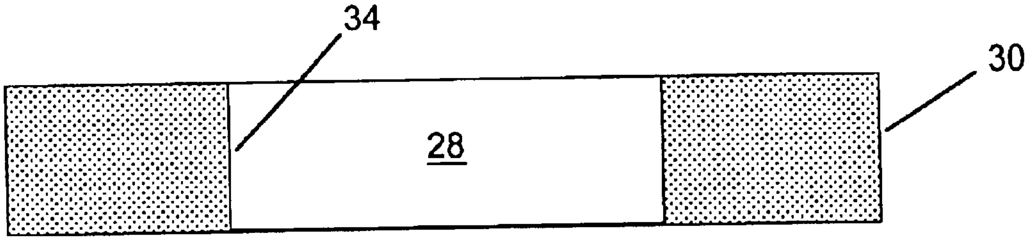
FIGS. 4(*a*)–4(*b*) schematically illustrate an example of steps for fabricating collector wafer 10, according to the present invention.
Figure 4B:
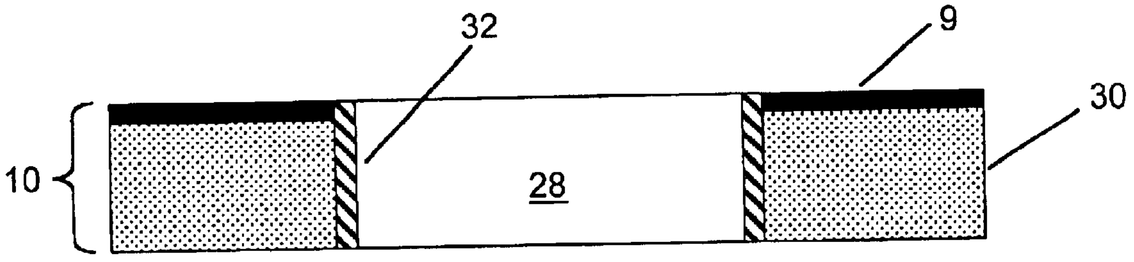

FIGS. 4(*a*)–4(*b*) schematically illustrate an example of the steps for fabricating collector wafer 10, according to the present invention. In FIG. 4(*a*) collector wafer 10 is prepared by cutting hole 28 in second substrate wafer 30 having a substantially flat surface and comprising a dielectric. Second substrate wafer 30 can comprise the same materials as first substrate wafer 8, e.g., GaAs, depending on the requirements of the specific device. Next, in FIG. 4(*b*), thermionic electron collector material is deposited along internal wall 34 of hole 28 to make collector electrode 32. Internal wall 34 may comprise multiple walls arranged in a complex geometric form or a single curved wall depending on the machining technology utilized. Electrical trace 9 is deposited on the surface of wafer 30, and makes electrical contact with collector electrode 32

Low work function materials useful in the present invention include barium, calcium and strontium oxides, mixtures of these oxides, along with additions of aluminum and scandium oxides, as adjunct oxides. Metals, such as tungsten, rhenium, osmium, ruthenium, tantalum, and iridium, or any combination of these metals, may be deposited into or on top of the mixture. Metal electrode materials, such as tungsten, molybdenum, tantalum, or their oxides can be used in conjunction with a cesium or barium vapor.

Figure 5A:
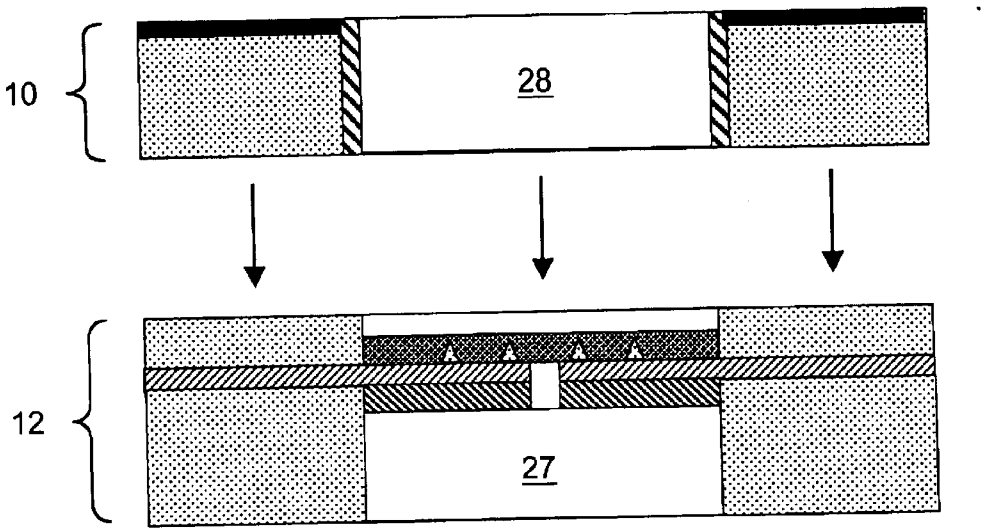
FIGS. 5(*a*)–5(*b*) schematically illustrate an example of steps for fabricating an upper assembly according to the present invention.
Figure 5B:
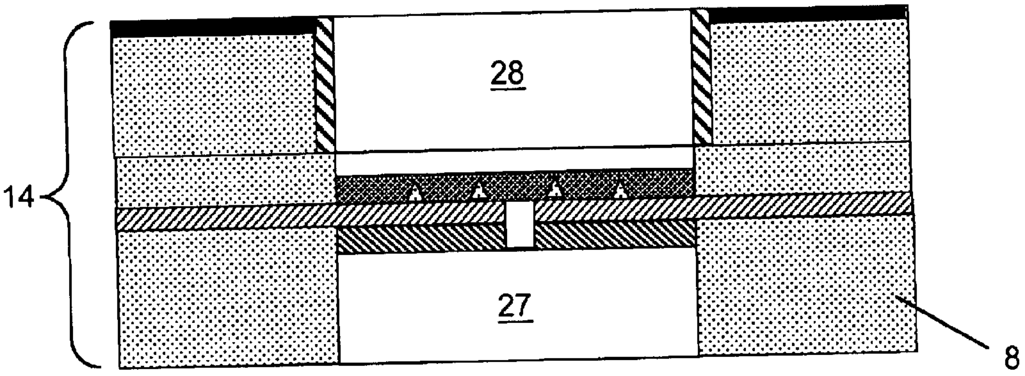
Figure 6A:
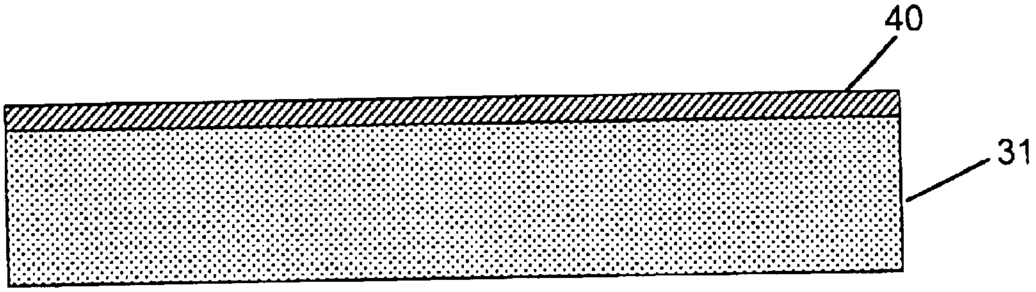
FIGS. 6(*a*)–6(*g*) schematically illustrate an example of steps for fabricating a fuel cup in an emitter wafer, according to the present invention.
Figure 6B:
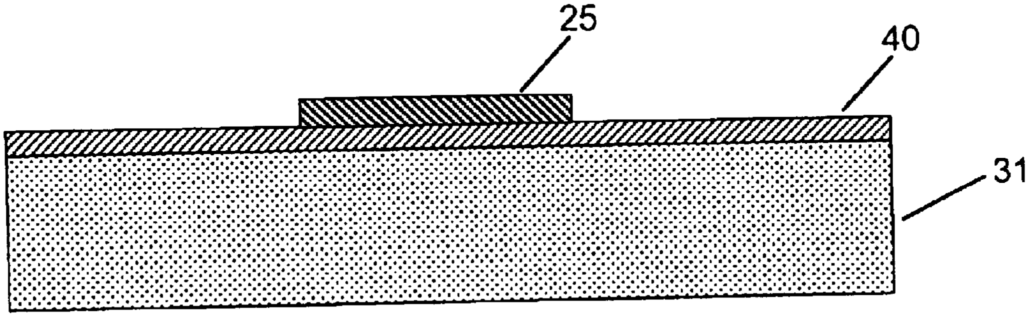
Figure 6C:
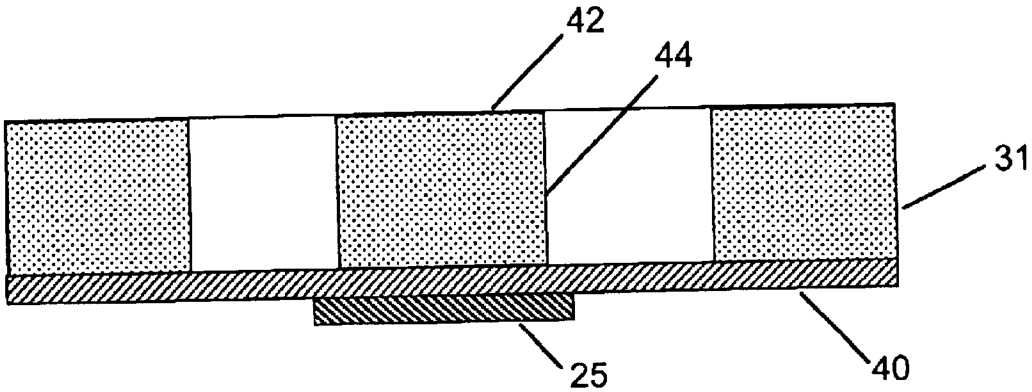
Figure 6D:
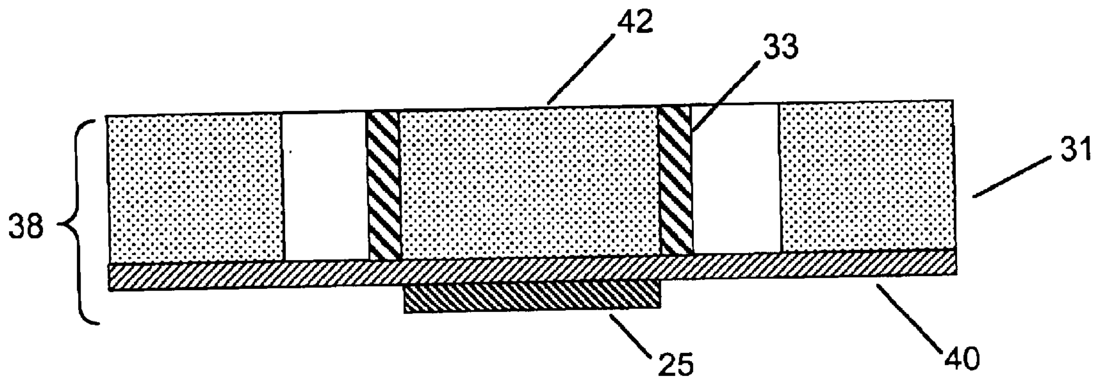
Figure 6E:
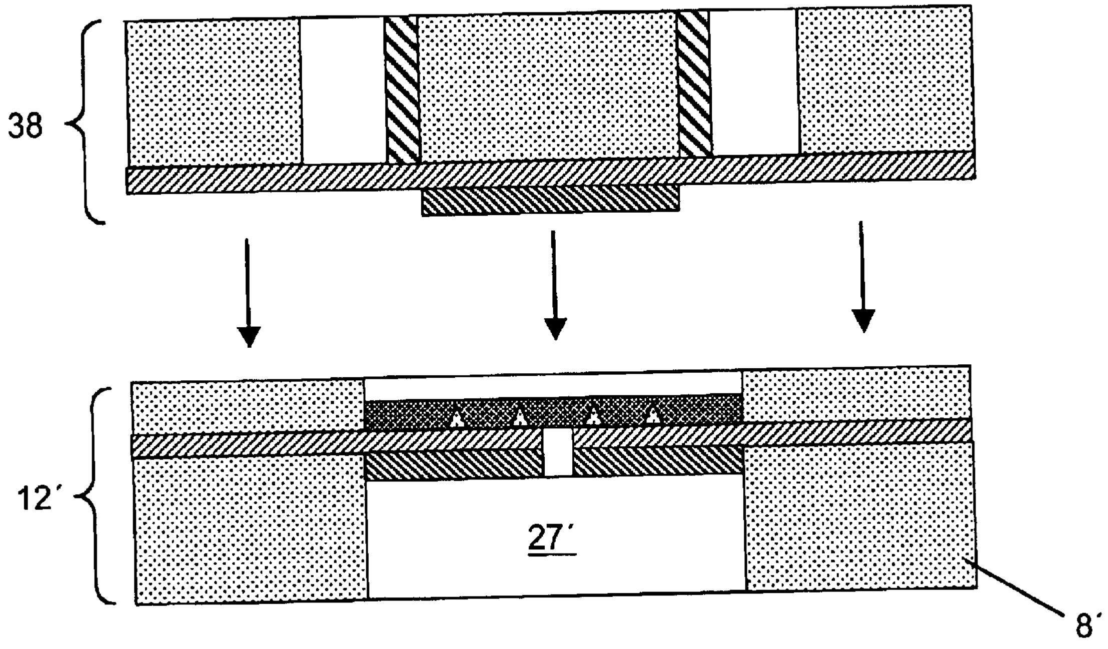
Figure 6F:
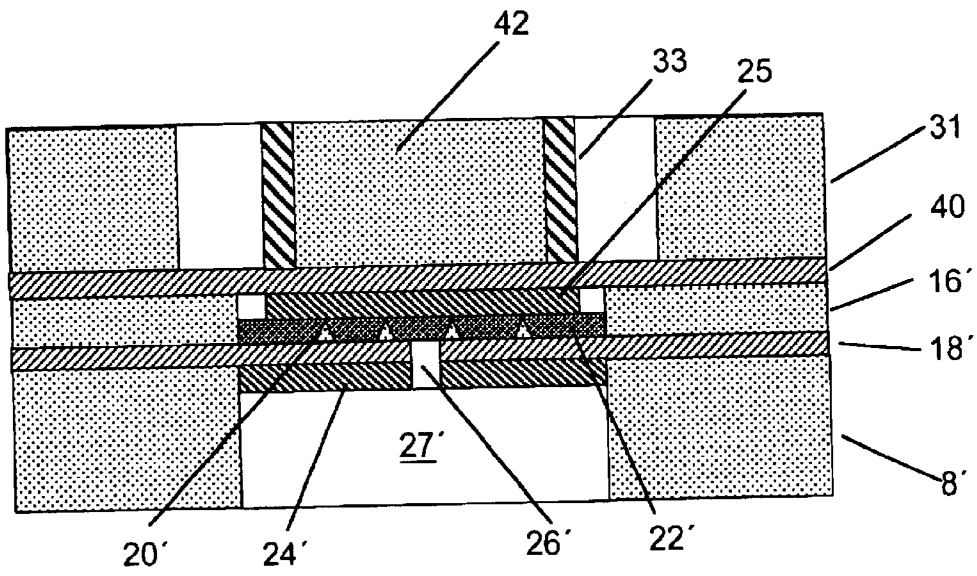
Figure 6G:
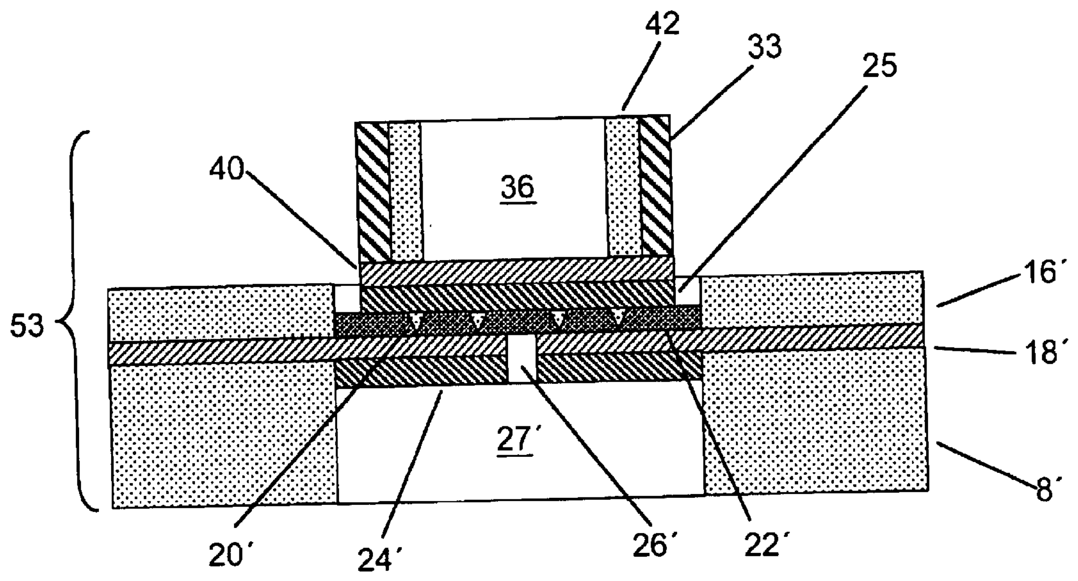

Next, in FIG. 5(*a*), collector wafer 10 is aligned and then bonded to the microspike array side of microspike wafer 12. This forms upper assembly 14, as shown in FIG. 5(*b*).

FIGS. 6(*a*)–6(*g*) illustrate schematically an example of the steps for fabricating fuel cup 36 in emitter wafer 38, according to the present invention. In FIG. 6(*a*) stop layer 40 is deposited or grown on third substrate wafer 31. Next, in FIG. 6(*b*) stop layer 40 is patterned, and then highly reflective layer 25 is surface deposited within the pattern on top of stop layer 40. Next, in FIG. 6(*c*), wafer 31 is inverted, patterned, and etched along the patterns to form fuel cup base 42. Next, in FIG. 6(*d*), thermionic electron emissive material is deposited on the etched surface of wafer 38 to make emitter electrode 33, and excess is removed through mask and micromachining techniques. The excess areas removed include all areas except outside wall 44 of fuel cup base 42. Next, in FIG. 6(*e*), the side of emitter wafer 38 with reflective layer 25 is aligned with and then bonded to the microspike array side of a second microspike wafer 12' to form the assembly shown in FIG. 6(*f*). Next, in FIG. 6(*g*), fuel cup 36 is formed by removing third substrate wafer 31 material from inside of fuel cup base 42. Excess wafer material 31 is also removed. Finally, stop layer 40 is selectively removed to complete formation of fuel cup 36 in emitter wafer 38, thereby forming fuel cup assembly 53. Alternatively (not illustrated), fuel source 48 can be deposited into a long, narrow trench, instead of a cylindrical cup 36. Emitter coating 33 and thermionic emissive materials would be applied to one or more surfaces of the trench, while maintaining the micron-sized interelectrode gap 76.

Figure 7A:
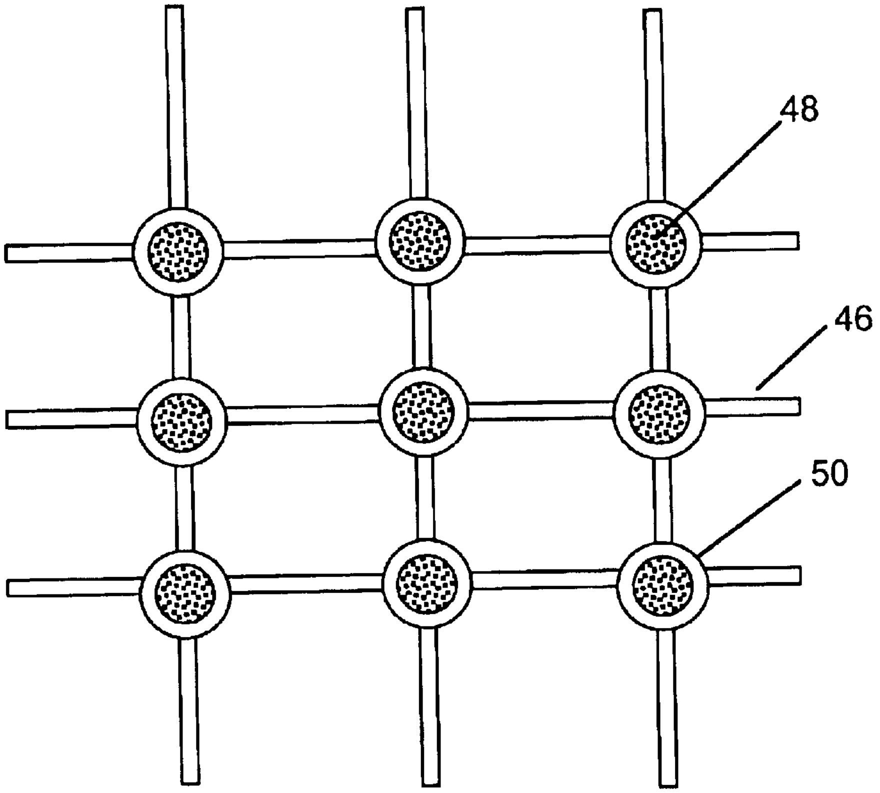
FIGS. 7(*a*)–7(*c*) schematically illustrate an example of steps for fabricating a lower assembly by inserting multiple thermal fuel sources into fuel cups, according to the present invention.
Figure 7B:
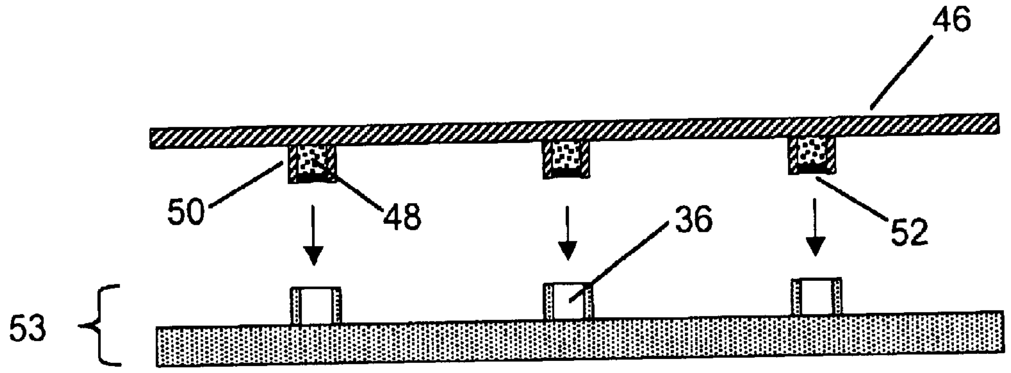
Figure 7C:
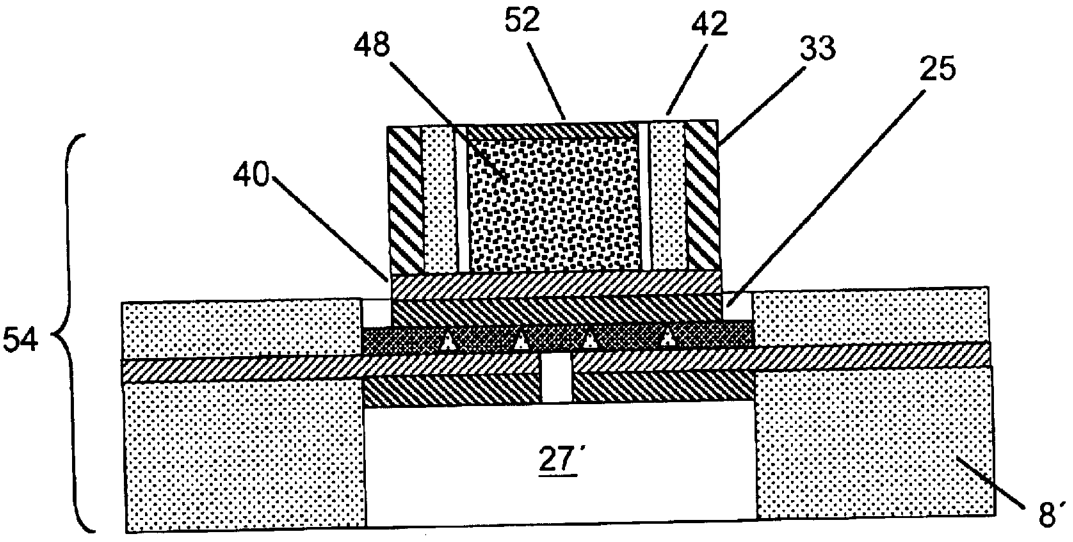
Figure 8A:
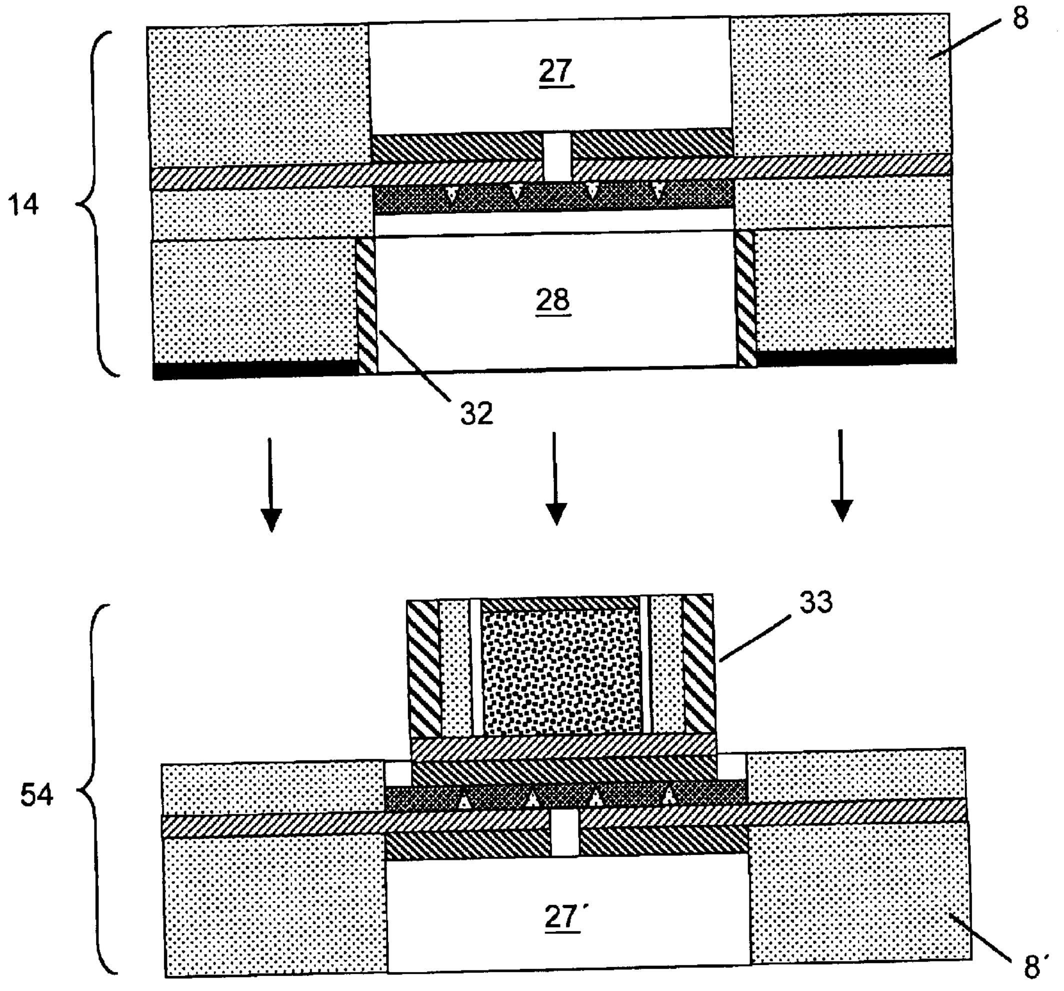
FIGS. 8(*a*)–8(*d*) schematically illustrate an example of steps for assembling the self-powered microminiature thermionic converter by combining the upper and lower assemblies, according to the present invention.
Figure 8B:
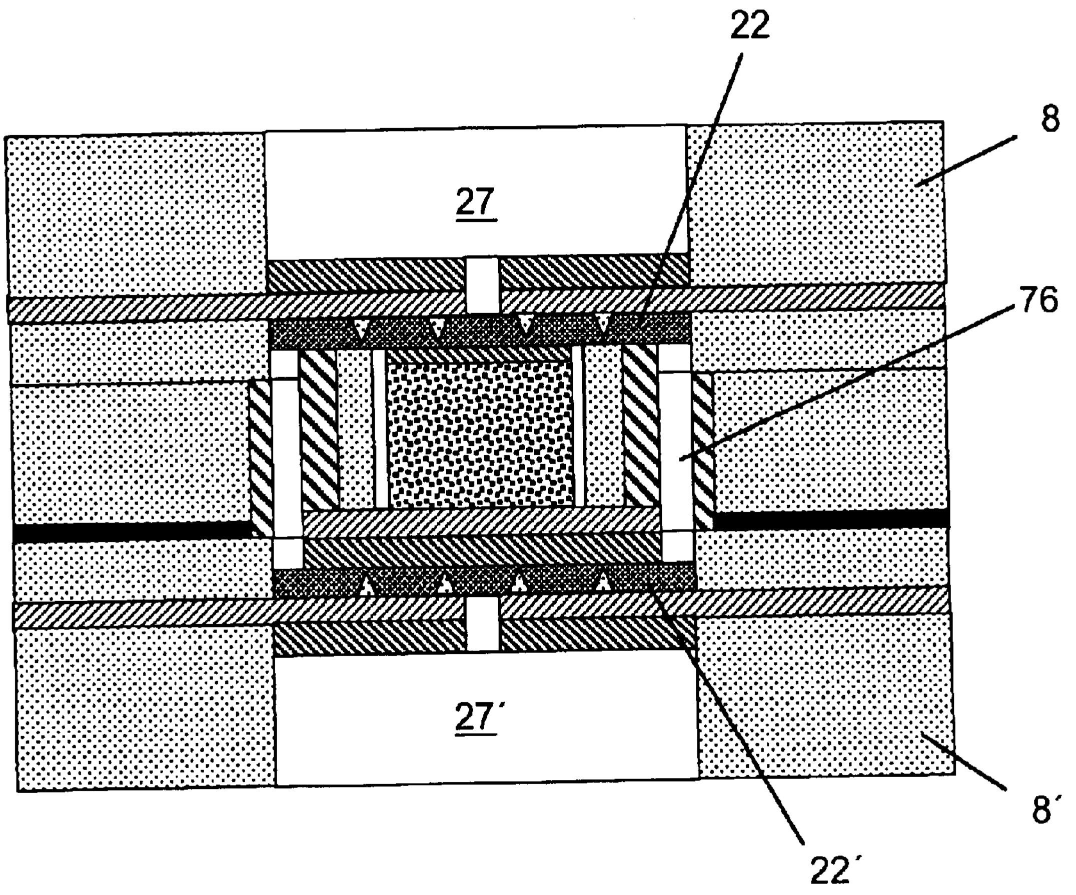
Figure 8C:
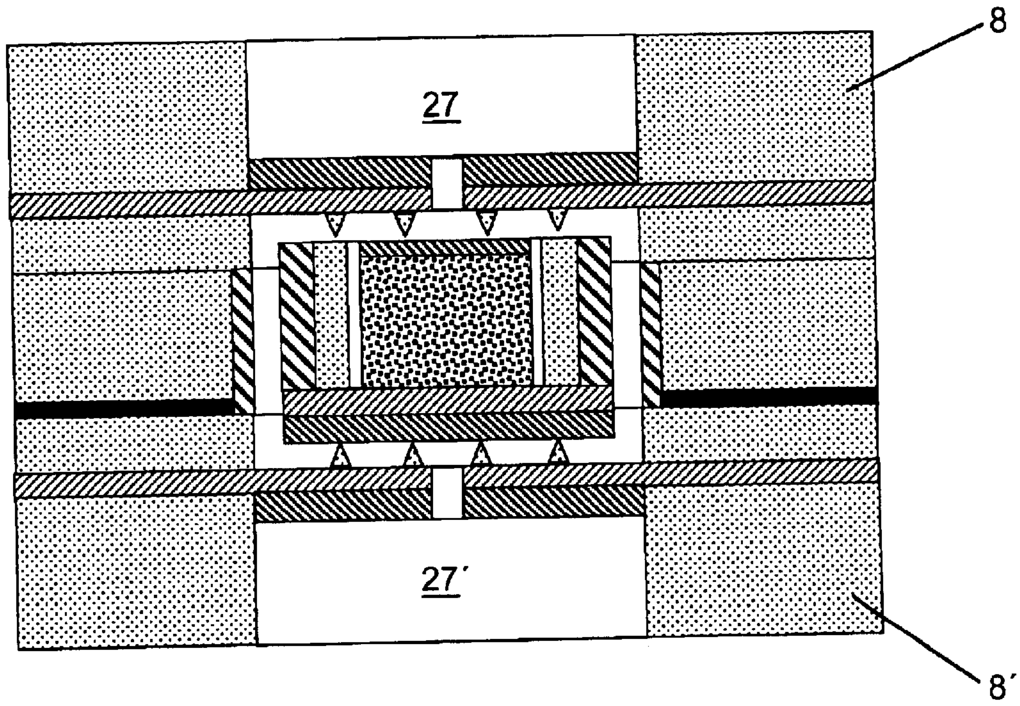
Figure 8D:
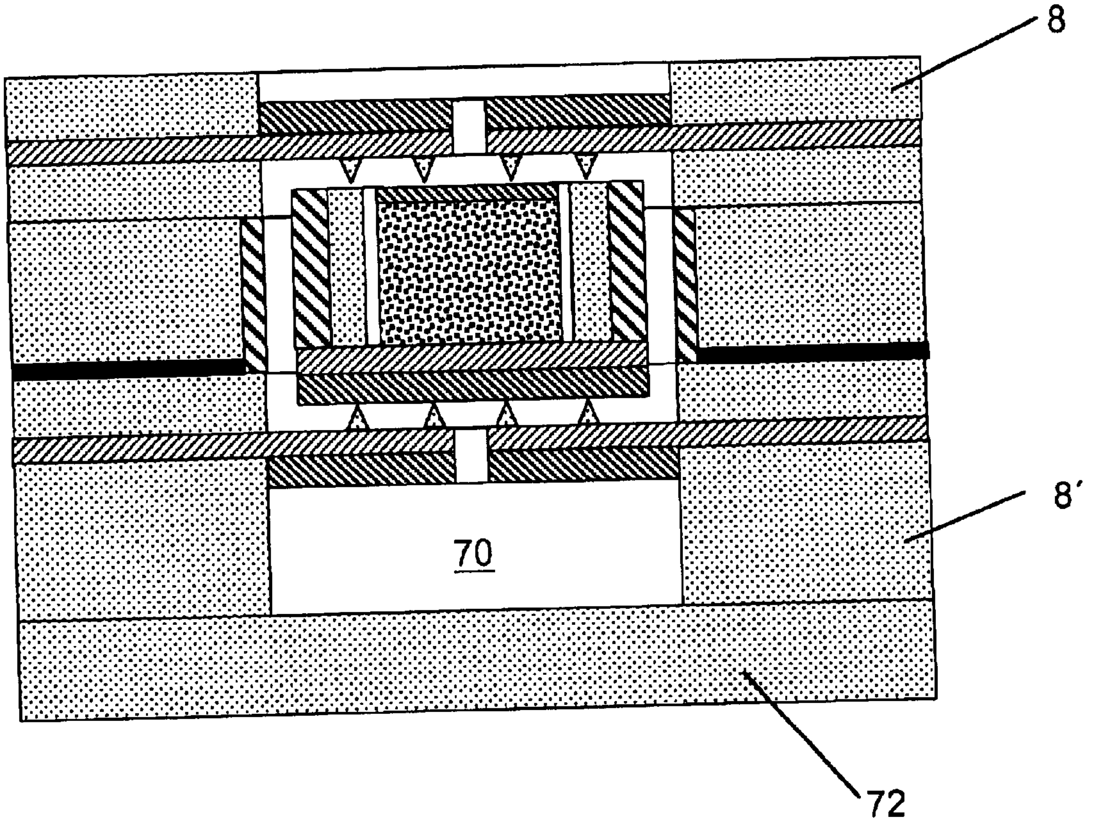

FIGS. 7(*a*)–7(*c*) schematically illustrate an example of the steps for fabricating lower assembly 54 by inserting multiple thermal fuel sources 48 into fuel cups 36, according to the present invention. In FIG. 7(*a*), precision grid 46 is fabricated, through techniques familiar in the art, with dissolvable source buckets 50. Fuel source 48 is deposited in source buckets 50 by evaporation or sputtering methods (if solid), or by liquid capillary action (if liquid). Highly reflective cap 52 (e.g., gold) is deposited on source 48. Fuel source 48 is shown in a cylindrical form, however, other shapes can be utilized (e.g., sphere, flat plate, wire, bar, etc). Also, thermionic electron emissive material can be deposited directly on to fuel source 48 (not illustrated). For example, thermionic electron emissive material can be deposited on a spherically shaped fuel source 48. Other metals that are highly IR reflective may be used as the cap material. Preferably, the cap material is comprised of a non-reactive material with a highly reflective surface to assist in preventing heat loss. Next, in FIG. 7(*b*), grid 46 is aligned over fuel cup assembly 53 in alignment with fuel cups 36. Next, source buckets 50 are inserted into fuel cups 36 and then grid 46 and buckets 50 are dissolved. The insertion step completes the fabrication of lower assembly 54, as shown in FIG. 7(*c*).

In FIG. 7(*c*), heat that is generated in fuel source 48 from capture of radioactive decay particles (e.g., alphas) is primarily conducted out though the bottom of source 48, then radially outwards inside stop layer 40 and through gold reflective layer 25, and then vertically up through inner cylindrical shells 42 and emitter electrode 33. Thermal radiation across the gap (assembly tolerance) between source 48 and wall 42 can also contribute to heating of emitter electrode 33.

FIGS. 8(*a*)–8(*d*) schematically illustrate an example of the steps for assembly of the self-powered microminiature thermionic converter by combining upper and lower assemblies 14, 54, according to the present invention. In FIG. 8(*a*) upper assembly 14 is aligned with lower assembly 54 such that full fuel cups 36 are inserted into holes 28 of collector wafer 14. Assemblies 14 and 54 are bonded by their joined faces, producing the assembly shown in FIG. 8(*b*). Micron-sized interelectrode gap 76 is defined by the outer diameter of emitter electrode 33 and the inner diameter of collector electrode 32. Next, in FIG. 8(*c*) photoresist layers 22, 22' of upper and lower assemblies 14, 54 are dissolved. Next, in FIG. 8(*d*) upper wafer 8 is lapped and thinned. Also, bottom plate 72 is attached to the lower side of lower wafer 8', thereby forming gas collection chamber 70 (e.g., for collecting helium gas from alpha particle radioactive decay of fuel source 48).

Figure 9:
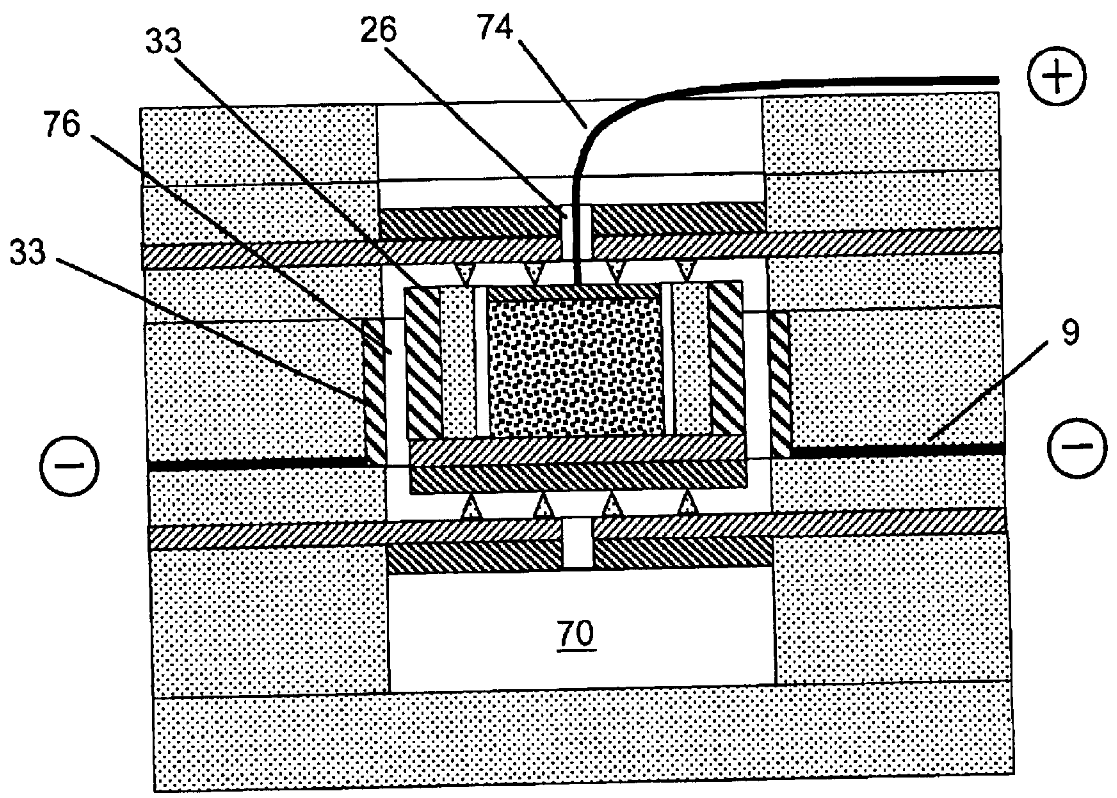
FIG. 9 schematically illustrates a completely assembled self-powered microthermionic convertor, according to the present invention.

FIG. 9 schematically illustrates an example of the present invention completely assembled according to the previously described steps. Electrical contact wire 74 has been attached and inserted through gas escape hole 26 to make electrical contact with highly IR reflective layer 52 disposed on fuel source 48, which is electrically connected to emitter electrode 33. Electrical contact wire 74 can comprise an intermittent, charged spring contact. Positive charges build up on the hot emitter electrode due to thermionic electron emission, which electrostatically attracts spring contact element 74 to make electrical contact with emitter electrode 33. After discharging the positive charge by allowing electrons to flow through contact 74, the physical contact is broken due to the loss of electrostatic force. Repeated cycles of intermittent contact provides intermittent current flow, with minimal heat loss when contact 74 is not touching the emitter electrode. Other means for creating an intermittent electrical contact can be provided, such as use of externally-controlled MEMS-type micromechanical actuators (e.g., comb drive, solenoid, etc.), and bimetallic strips that bend when heated or cooled. Electrons that are emitted thermionically from emitter electrode 33 travel across the interelectrode gap 76 and are collected by collector electrode 32, whereupon the collected electrons travel through electrical trace 9 to the electrical load, and then back through wire 74 to return to emitter electrode 33, thereby creating a closed electrical circuit.

Variations and modifications of the present invention will be obvious to those skilled in the art and it is intended to cover in the appended claims all such modifications and equivalents.

Figure 10:
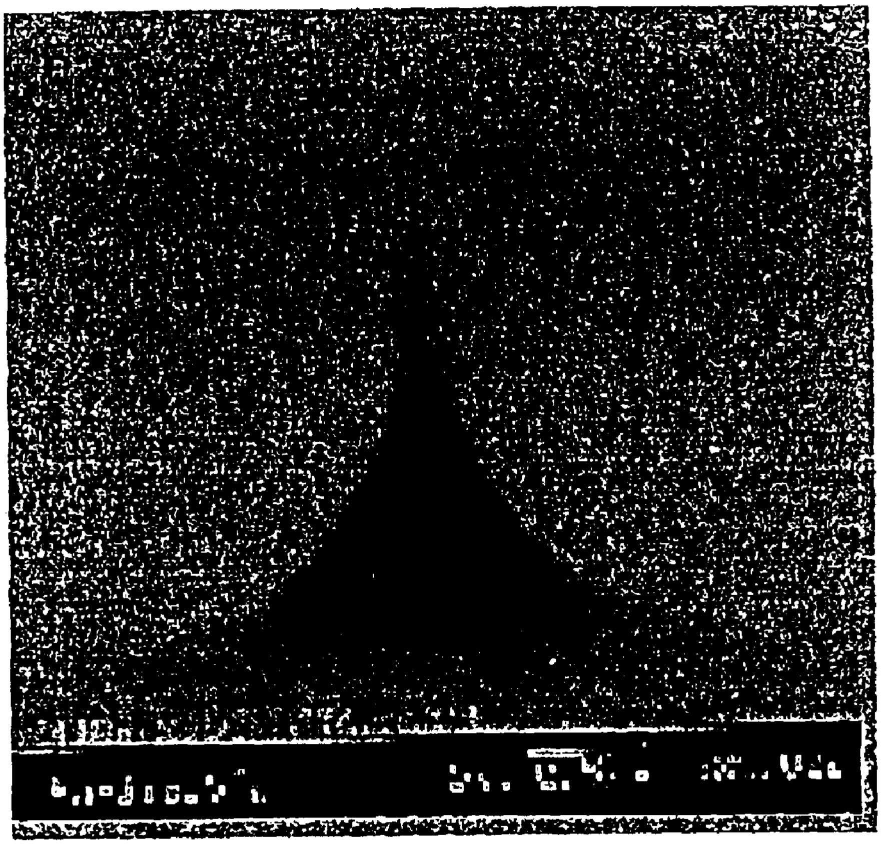
FIG. 10 shows a scanning electron microscope image of a 1 micron tall GaAs microspike with a sharp, cusp-like tip, according to the present invention.

FIG. 10 shows a scanning electron microscope image of a 1 micron tall GaAs microspike with a sharp, cusp-like tip, according to the present invention.

Figure 11:
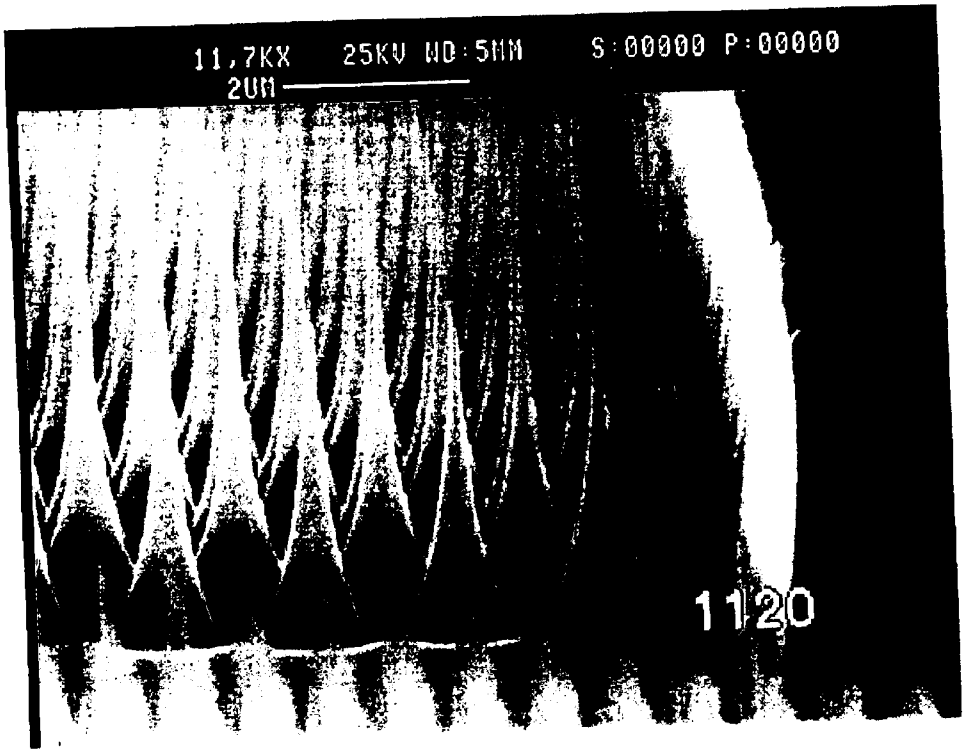
FIG. 11 shows a scanning electron microscope image of a hexagonal array of 3 micron tall GaAs microspikes with sharp, cusp-like tips, made by high temperature reactive ion beam etching, according to the present invention.

FIG. 11 shows a scanning electron microscope image of a hexagonal array of 3 micron tall GaAs microspikes with sharp, cusp-like tips, made by high temperature reactive ion beam etching, according to the present invention.

The entire disclosures of all references, applications, patents, and publications cited above are hereby incorporated by reference.

What is claimed is:

1. A self-powered microthermionic converter comprising:

an emitter electrode;

a collector electrode separated from said emitter electrode a micron-scale interelectode gap;

a self-powered thermal power source in thermal contact with said emitter electrode;

means for removing electrons emitted by the emitter electrode; and means for returning the emitted electrons to the collector electrode;

wherein said interelectrode gap is less than about 10 $\mu$m.

2. The microthermionic converter of claim 1, wherein said interelectrode gap is between approximately 1 $\mu$m and approximately 10 $\mu$m.

3. The microthermionic converter of claim 2, wherein said interelectrode gap is between approximately 1 $\mu$m and 3 $\mu$m.

4. The microthermionic converter of claim 1, wherein said interelectrode gap comprises a vacuum.

5. The microthermionic converter of claim 1, wherein said interelectrode gap comprises an encapsulated, low pressure, vapor system, wherein the vapor coats the electrode surfaces, resulting in a reduced work function.

6. The microthermionic converter of claim 5, wherein said vapor is selected from the group consisting of cesium and barium vapors.

7. The microthermionic converter of claim 1, wherein said thermal power source comprises a radioactive isotope.

8. The microthermionic converter of claim 7, wherein said radioactive isotope comprises an alpha-emitting isotope selected from the group consisting of Curium-242, Curium-244, and Polonium-210.

9. The microthermionic converter of claim 1, wherein a thermionic emissive material is used in the composition of an electrode selected from the group consisting of the emitter electrode and the collector electrode.

10. The microthermionic converter of claim 9, wherein the thermionic emissive material comprises an alkaline earth oxide.

11. The microthermionic converter of claim 10, wherein the alkaline earth oxide comprises at least one material selected from the group consisting of barium oxide, strontium oxide, and calcium oxide.

12. The microthermionic converter of claim 10, wherein the thermionic emissive material further comprises an adjunct oxide selected from the group consisting of aluminum oxide and scandium oxide.

13. The microthermionic converter of claim 10, wherein the thermionic emissive material further comprises a metal selected from the group consisting of tungsten, rhenium, osmium, iridium, ruthenium, osmium, iridium, and mixtures thereof.

14. The microthermionic converter of claim 10, further comprising a metal capping layer disposed on the thermionic emissive material, wherein the metal capping layer comprises a material selected from the group consisting of scandium, scandium oxide, and mixtures thereof.

15. The microthermionic converter of claim 10, wherein the environment in the interelectrode gap comprises a vacuum.

16. The microthermionic converter of claim 10, wherein the thermionic emissive material comprises a material selected from the group consisting of tungsten, molybdenum, tantalum, tungsten oxide, molybdenum oxide, tantalum oxide, and mixtures thereof.

17. The microthermionic converter of claim 16, wherein the environment in the interelectrode gap comprises a vapor selected from the group consisting of cesium and barium vapors.

18. The microthermionic converter of claim 1, a length of said emitter electrode is less than approximately 200 $\mu$m.

19. The microthermionic converter of claim 18, wherein said emitter electrode length is between approximately 50 $\mu$m and approximately 200 $\mu$m.

20. The microthermionic converter of claim 19, wherein said emitter electrode length is between approximately 50 $\mu$m and approximately 100 $\mu$m.

21. The microthermionic converter of claim 1, additionally comprising a thermal heat barrier.

22. A self-powered microthermionic converter comprising:

an emitter electrode;

a collector electrode separated from said emitter electrode by a micron-scale interelectrode gap;

a self-powered thermal power source in thermal contact with said emitter electrode;

means for removing electrons emitted by the emitter electrode;

means for returning the emitted electrons to the collector electrode; and additionally comprising a thermal heat barrier;

wherein said thermal heat barrier comprises a micro heat barrier comprising a plurality of microspikes and at least one highly IR reflective surface.

23. A self-powered microthermionic converter comprising:

an emitter electrode;

a collector electrode separated from said emitter electrode by a micron-scal interelectrode gap;

a self-powered thermal power source in thermal contact with said emitter electrode;

means for removing electrons emitted by the emitter electrode;

means for returning the emitted electrons to the collector electrode; and additionally comprising an electrically insulating material disposed between non-interacting portions of said emitter electrode and collector electrode.

24. The microthermionic converter of claim 1, wherein a temperature for operation is between approximately 850 K and approximately 1200 K.

25. The microthermionic converter of claim 24, wherein said temperature for operation is between approximately 1100 K and approximately 1200 K.

26. The microthermionic converter of claim 1, wherein said collector electrode and emitter electrode comprise a diode.

27. The microthermionic converter of claim 1, additionally comprising a fuel cup.

28. The microthermionic converter of claim 27, wherein said fuel cup comprises an outer surface and said outer surface is coated with a thermionic emissive material comprising said emitter electrode.

29. A method of converting heat to electrical energy using thermionic electron emission comprising the steps of:
- providing an incorporated thermal power source that is in thermal contact with an emitter electrode;
- heating the emitter electrode with the incorporated thermal power source, thereby causing electrons to be emitted from the emitter electrode;
- streaming electrons emitted from the emitter electrode across a micron-spaced interelectrode gap to a collector electrode;
- collecting the electrons reaching the collector electrode;
- providing the collected electrons to an external electrical load; and
- returning the electrons to the emitter electrode, thereby completing an electrical circuit;
- wherein said interelectrode gap is less than about 10 $\mu$m.

30. The method of claim 29, wherein thermal power source comprises a radioisotope.

31. The method of claim 30, wherein the radioisotope comprises an alpha-emitting radioisotope from the group consisting of Curium-242, Curium-244, and Polonium-210.

32. The method of claim 29, wherein the step of placing an incorporated thermal power source in thermal contact with an emitter electrode comprises enclosing the power source within the emitter electrode.

33. The method of claim 29, additionally comprising the step of utilizing a heat barrier on the non-diode regions of the thermal source.

34. A method of manufacturing a self-powered microthermionic converter comprising the steps of:
- providing a thermally and electrically insulating material as a substrate;
- forming at least one fuel cup having an outer surface from the substrate through micromachining techniques;
- depositing at least one thermionic electron emissive layer on the outer surface of the fuel cup to provide an emitter electrode;
- forming a collector electrode by depositing at least one layer of a thermionic electron emissive material on the substrate while maintaining a micron-spaced interelectrode gap between the collector electrode and emitter electrode; and
- placing a thermal power source inside the fuel cup.

35. The method of claim 34, wherein the thermal power source comprises a radioisotope.

36. The method of claim 35, wherein the radioisotope comprises an alpha-emitting radioisotope from the group consisting of Curium-242, Curium-244, and Polonium-210.

37. The method of claim 34, further comprising enclosing the fuel source within the emitter electrode.

38. The method of claim 34, further comprising the step of disposing a thermal heat barrier internally on the base of the fuel cup.

39. The method of claim 34, wherein the interelectrode gap is less than about 10 $\mu$m.

40. The method of claim 39, wherein the interelectrode gap is between approximately 1 $\mu$m and approximately 10 $\mu$m.

41. The method of claim 40, wherein the interelectrode gap is between approximately 1 $\mu$m and approximately 3 $\mu$m.

42. The method of claim 34, further comprising providing a vacuum in the micron-spaced interelectrode gap.

43. The method of claim 34, wherein the step of providing a micron-spaced interelectrode gap between the collector electrode and emitter electrode comprises providing a low pressure vapor within the micron-space interelectrode gap, wherein the vapor coats the electrode surfaces, resulting in a reduced work function.

44. The method of claim 34, wherein the vapor is selected from the group consisting of barium and cesium vapors.

45. The method of claim 34, additionally comprising the step of forming a fuel cup and forming a collector electrode by using micromachining techniques.

46. The method of claim 34, wherein the step of disposing at least one thermionic electron emissive layer on an outer surface of the fuel cup to provide a emitter electrode is through vapor deposition.

47. The method of claim 34, additionally comprising the step of incorporating the converter in a micromachine or microcircuit.

48. The method of claim 34, wherein the step of forming a fuel cup additionally comprises the steps of:
- forming a fuel grid;
- inserting the thermal power source in the fuel cup;
- capping the fuel cup; and
- dissolving the fuel grid.

49. The method of claim 48, wherein the step of inserting the thermal power source in the fuel cup comprises inserting a radioisotope as the thermal power source.

50. The method of claim 49, wherein the step of inserting the thermal power source in the fuel cup comprises inserting an alpha-emitting radioisotope selected from the group consisting of Curium-242, Curium-244, and Polonium-210.

51. The method of claim 49, wherein the step of capping the fuel cup comprises capping the fuel cup with a non-reactive metal.

52. The method of claim 51, wherein the step of capping the fuel cup comprises capping the fuel cup with gold.

53. The method of claim 51, wherein the step of capping the fuel cup comprises capping the fuel cup with a highly reflective, non-reactive material.

54. The method of claim 48, wherein the step of forming a fuel grid comprises fabricating a precision grid having dissolvable source buckets.

* * * * *